United States Patent

Besser

[15] 3,649,925

[45] Mar. 14, 1972

[54] HIGH FREQUENCY AMPLIFIER

[72] Inventor: Leslie Besser, Los Altos, Calif.

[73] Assignee: Hewlett-Packard Company, Palo Alto, Calif.

[22] Filed: July 20, 1970

[21] Appl. No.: 56,276

[52] U.S. Cl. .................................330/13, 330/17, 330/20, 330/28

[51] Int. Cl. .................................H03f 3/18

[58] Field of Search .................330/13, 17, 20, 26, 28, 101, 330/102, 105

[56] References Cited

UNITED STATES PATENTS 3,239,770 3/1966 Taber..................................330/28 X

FOREIGN PATENTS OR APPLICATIONS 594,479 6/1959 Italy........................................330/17

1,289,119 2/1969 Germany................................330/28

*Primary Examiner*—Roy Lake

*Assistant Examiner*—James B. Mullins

*Attorney*—Roland I. Griffin

[57] ABSTRACT

The gain of a two stage transistor amplifier is made constant with frequency through the use of overall shunt and series feedback in conjunction with local shunt feedback around the second stage to control the phase shift of the amplifier. Overall shunt and series feedback are also used to set the input and output impedances of the amplifier.

4 Claims, 3 Drawing Figures

INVENTOR.
LESLIE BESSER
BY Roland D. Griffin

INVENTOR.
LESLIE BESSER
BY Roland I. Griffin

HIGH FREQUENCY AMPLIFIER

BACKGROUND AND SUMMARY OF THE INVENTION

The phase shift through a transistor amplifier changes rapidly with frequency accompanied by a steady decrease in gain as the frequency of operation approaches the unity gain frequency of the transistor (denoted herein as $F_T$), unless suitable compensation means are employed. In the prior art reactive feedback elements were used to compensate transistor amplifiers for gain falloff at higher frequencies. The process of compensating a transistor amplifier was often tedious and it resulted in a complex amplifier. The limitations of the process made it difficult to build constant gain amplifiers in the frequency region above 100 megahertz.

The preferred embodiments of the present invention use resistive feedback elements to control the phase shift through the amplifier and to set the gain, the input impedance and the output impedance of the amplifier. A local shunt feedback resistor around the second stage of the amplifier sets the phase shift to a predetermined function of frequency. The phase shift at frequencies below 0.1 $F_T$ (denoted herein as low frequencies) is −180° and, with the local shunt feedback loop closed, changes linearly to approximately −360° at frequencies of about 0.4 $F_T$ (denoted herein as high frequencies). The overall shunt and series feedback resistors determine the input and output impedances and, in conjunction with the local shunt feedback resistor, set the gain. The effect of the overall feedback loops is degenerative at low frequencies due to the −180° phase shift through the amplifier and the effect of the overall feedback becomes regenerative at high frequencies due to the additional −180° of phase shift. This linear change from degenerative to regenerative feedback is used to maintain the gain of the amplifier constant with frequency, and the present technique reduces the need for reactive feedback and the tedious compensation process.

DESCRIPTION OF THE PREFERRED EMBODIMENT

Figure 1:
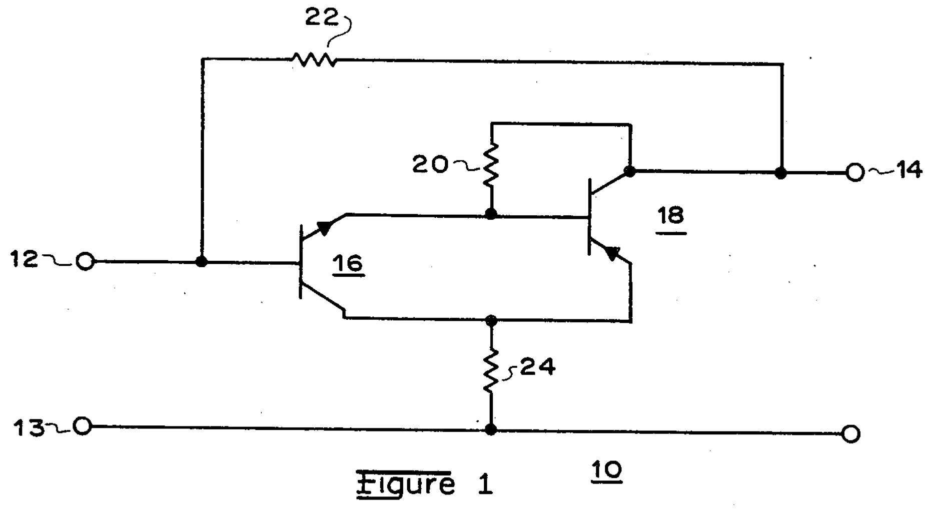
FIG. 1 shows the AC equivalent of a two stage high-frequency amplifier constructed according to one of the preferred embodiments of the present invention.

The AC equivalent of an amplifier 10 shown in FIG. 1 has an input 12, an output 14, and common terminal 13. Input 12 is connected to the base terminal of a transistor 16 and the emitter of transistor 16 is connected to the base terminal of transistor 18. Output 14 is connected to the collector terminal of transistor 18. Transistor 16 comprises a first stage and transistor 18 comprises a second stage of amplifier 10. The collector terminal of transistor 16 and emitter terminal of transistor 18 are connected to common terminal 13 through a series feedback resistor 24, making the first stage a common collector stage and the second stage a common emitter stage. Local shunt feedback around the second stage is provided by a resistor 20 connected between the base and collector terminals of transistor 18. Overall shunt feedback is provided by resistor 22 connected between output 14 and input 12.

The common collector first stage of the amplifier has an output impedance which closely matches the input impedance of the second stage to effect maximum power transfer from the first to the second stage. The local feedback around the second stage, resistor 20, reduces the open loop phase shift through the amplifier to make it stable at high frequencies. Without this feedback the phase shift through the amplifier would change in a rapid and nonlinear fashion with increasing frequency and the amplifier would not be usable at frequencies much greater than 0.1 $F_T$. To set the gain of the whole amplifier a combination of overall shunt and series feedback, resistors 22 and 24, is used. The effect of the overall feedback may be degenerative or regenerative, depending upon the phase shift through the amplifier. At low frequencies the phase shift is −180° and the overall feedback is therefore degenerative. At high frequencies the phase shift approaches −360° and the overall feedback is then regenerative. At a phase shift of 270° the feedback is essentially zero. The local shunt feedback, resistor 20, determines the zero feedback frequency. The zero feedback frequency, in conjunction with the overall series and shunt feedback, determines whether the gain of the amplifier will be constant, decreasing, or increasing as a function of frequency. Resistor 20 may be a variable resistor to enable the user of the amplifier to vary the gain-frequency function at will. The values of resistors 22 and 24 also determine the input and output impedance of amplifier 10.

Figure 2:
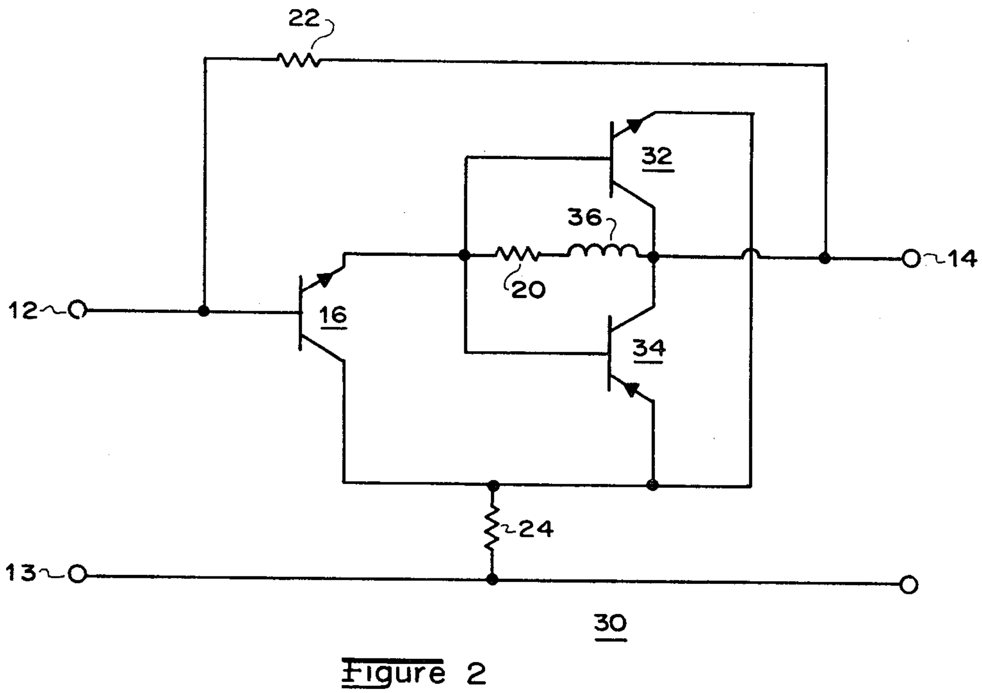
FIG. 2 shows the AC equivalent of a two stage high-frequency amplifier constructed according to another preferred embodiment of the present invention.

The second stage of an amplifier 30 shown in FIG. 2 includes a PNP-NPN complementary pair of transistors, transistors 32 and 34. In the AC equivalent circuit transistors 32 and 34 are connected in parallel to effect higher output power capabilities. The operation of amplifier 30 is otherwise identical to amplifier 10 since the two transistor second stage may be treated as a single larger transistor, except for biasing considerations. As shown, an inductor 36 may be added in series with local shunt feedback resistor 20 to increase the upper frequency limit of operation of the amplifier by increasing high frequency phase shift.

Figure 3:
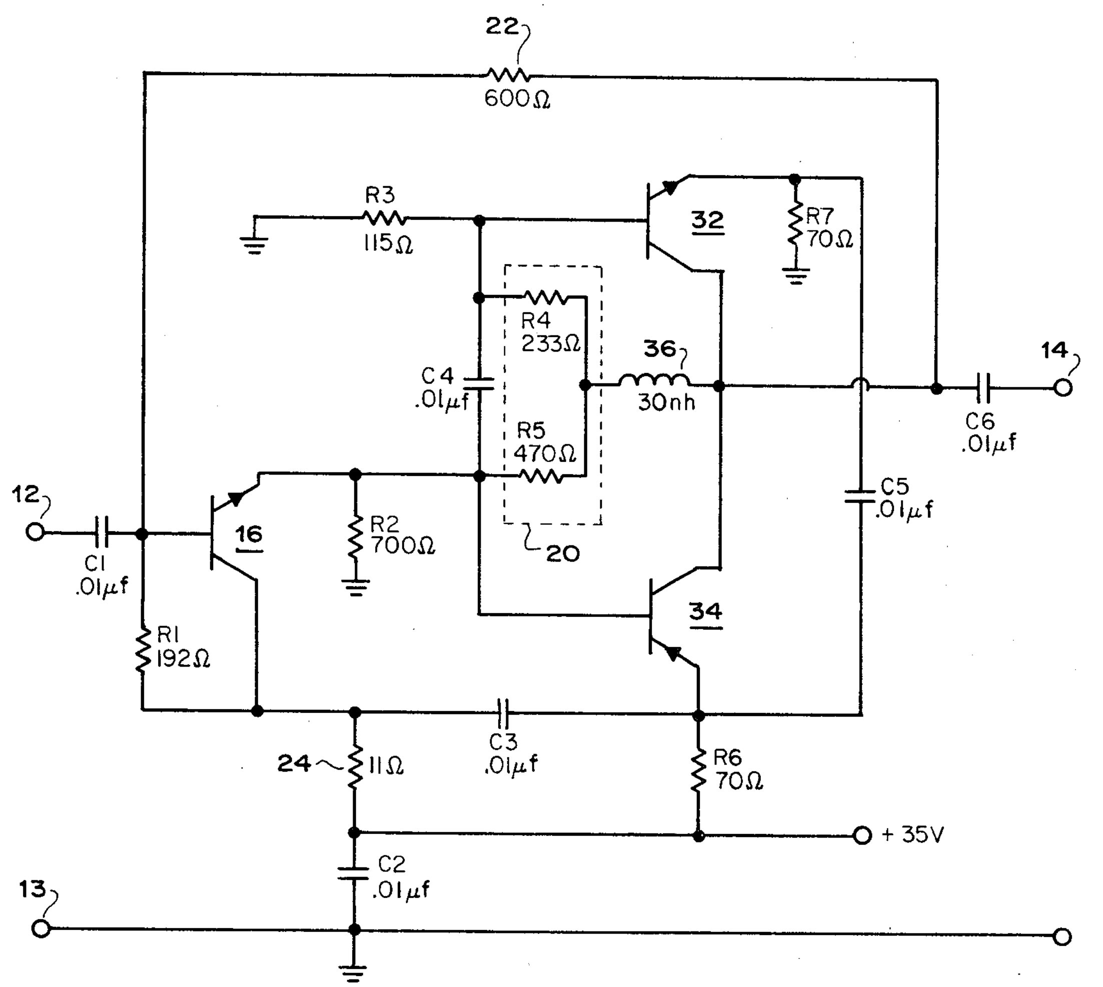
FIG. 3 shows a two stage high-frequency amplifier, including biasing, constructed according to a preferred embodiment of the present invention.

FIG. 3 shows amplifier 30 with the components necessary for biasing added; standard hybrid thin film technology was used to construct the circuit. Resistors R1,2,3,6,7 are bias resistors, capacitors C1,3,4,5,6 are blocking capacitors and capacitor C2 is a bypass capacitor. Resistors R4 and R5 appear to be parallel to an AC signal and thus act together as local shunt feedback resistor 20. Transistors 16, 32 and 34 have an $F_T$ of approximately 1.2 gigahertz. The values shown for the components have been found to give satisfactory performance in the 40 to 300 megahertz frequency range, producing a gain of 17 db., an input impedance of 75 ohms, and an output impedance of 50 ohms.

I claim:

1. A multistage transistor amplifier comprising:

a first stage including a first transistor having emitter, base, and collector terminals connected in the common collector configuration;

means for applying an input signal between the base and collector terminals of the first transistor;

a second stage including a second and third transistor, each having base, emitter, and collector terminals, connected in the common emitter configuration, the second being a PNP-type and the third being an NPN-type transistor, each terminal of the second transistor being connected through circuit means to the respective terminal of the third transistor, the second stage having local shunt feedback means connected between the collector and base terminals of the second and third transistors for controlling the phase shift of the amplifier;

means for connecting the emitter of the first transistor to the base terminals of the second and third transistors;

means for deriving an output signal between the emitter and collector terminals of the second and third transistors;

overall shunt feedback means connected between the input and output means and overall series feedback means connected in series with the AC current path of the collector terminal of the first transistor and the emitter terminals of the second and third transistors, the overall shunt feedback means and overall series feedback means being selected to provide predetermined input and output impedances and, in conjunction with the selection of the local shunt feedback means a predetermined overall gain.

2. A multistage transistor amplifier as in claim 1 wherein the overall shunt and overall series feedback means are resistive.

3. A multistage transistor amplifier as in claim 1 wherein the local shunt feedback is resistive.

4. A multistage transistor amplifier as in claim 1 wherein the local shunt feedback includes a resistor and an inductor.

* * * * *